United States Patent

Jin

Patent Number: 5,953,447
Date of Patent: Sep. 14, 1999

[54] METHOD FOR RECOGNIZING A PRINTED CIRCUIT BOARD FIDUCIAL MARK IN ORDER TO DECIDE ORIGIN POINT IN CHIP MOUNTER

[75] Inventor: Sang-Hun Jin, Daegu, Rep. of Korea

[73] Assignee: Daewoo Electronics Co., Ltd., Seoul, Rep. of Korea

[21] Appl. No.: 08/808,503

[22] Filed: Feb. 27, 1997

[30] Foreign Application Priority Data

Feb. 28, 1996 [KR] Rep. of Korea ......................... 96-5115
Feb. 28, 1996 [KR] Rep. of Korea ......................... 96-5116
Feb. 28, 1996 [KR] Rep. of Korea ......................... 96-5117

[51] Int. Cl.$^6$ .................................................. G06K 9/00
[52] U.S. Cl. ...................... 382/145; 382/147; 382/151; 348/87; 348/126; 250/559.3; 356/375
[58] Field of Search ........................ 382/145, 147, 382/151; 348/87, 126; 250/559.3; 356/375

[56] References Cited

U.S. PATENT DOCUMENTS

| | | | |
|---|---|---|---|
| 4,475,122 | 10/1984 | Green | 358/101 |
| 5,018,212 | 5/1991 | Manns et al. | 382/8 |
| 5,086,478 | 2/1992 | Kelly-Mahaffey et al. | 382/8 |
| 5,138,667 | 8/1992 | Roch et al. | 382/1 |
| 5,621,811 | 4/1997 | Roder et al. | 382/147 |
| 5,741,114 | 4/1998 | Onodera | 414/783 |

*Primary Examiner*—Leo H. Boudreau
*Assistant Examiner*—Kanji Patel
*Attorney, Agent, or Firm*—Pillsbury Madison & Sutro LLP

[57] ABSTRACT

Disclosed is a method for recognizing a printed circuit board fiducial mark in order to decide an origin point in a chip mounter so that electronic parts can be mounted on a desired position of the printed circuit board. Since the method can be used for a distorted image, it can exactly recognize a damaged object as well as a general object. The method can also reduce a calculation amount relative to a polarity number of a candidate object when the candidate object has the polarity number. The method can recognize a candidate object of the same pattern fiducial mark regardless of its size.

10 Claims, 8 Drawing Sheets

METHOD FOR RECOGNIZING A PRINTED CIRCUIT BOARD FIDUCIAL MARK IN ORDER TO DECIDE ORIGIN POINT IN CHIP MOUNTER

BACKGROUND OF THE INVENTION

1. Field of the Invention

The present invention relates to a method for recognizing a printed circuit board (PCB) fiducial mark, and more particularly to a method for recognizing a PCB fiducial mark in order to decide an origin point in a chip mounter so that electronic parts can be mounted on a desired position of the PCB.

2. Description of the Prior Art

An internal circuit is used for connecting a number of parts in order to attain an operation of a device which performs the operation. A PCB is comprised of several electronic components that are integrated on a small panel. The greatest distribution of the electronic components is manufactured by a printing method. Currently, printed circuit boards of a single pattern contain a high density of electronic components in order to reduce the size of both faces of the board. Because electronic machines tend to be popular, printed circuit boards with a single pattern have been manufactured in large quantities at one time.

PCB fiducial marks are used as a reference location for yielding location data of electronic components for inserting into the PCB by indicating marks such as a circle, a triangle, or a square and recognizing a location, a direction, and a distance of the PCB. Chip mounters recognize a fiducial mark indicated on a PCB, on which electronic parts such as a semiconductor, a resistor, and a capacitor are mounted, so a location, a direction, and a distance of the PCB can be determined.

In the PCB, there characteristically exist a plurality of candidate objects around the fiducial mark due to a circumstance and an illumination. If a same algorithm is applied to the plurality of candidate objects as that which is applied to real fiducial marks, in order to recognize the fiducial mark, the calculation amount is congested. Therefore, it is necessary to divide a real fiducial mark from plurality of candidate objects. The best method for dividing a real fiducial mark from other candidate objects is a method in which geometrical characteristics are used.

U.S. Pat. No. 5,138,667, (issued to Roger H. Rich, Vaclav VINOUS, and Caimans on Aug. 11, 1992) discloses one example of a PCB fiducial mark recognition method for deciding an origin point in a chip mounter. U.S. Pat. No. 5,138,667 is directed to a process and device for detecting print registration marks on a multi-color printing press processing sheet or web-shaped matter having an area for printing of accuracy control signs or marks. A process consists of detecting a print registration mark composed of recognition signals and of a color pilot mark, comparing the image of the signs of the printed registration mark to the signs of a virtual reference registration mark, then defining a basic area for each sign, calculating a geometric center of every basic area, detecting any color pilot mark in these basic areas, calculating and memorizing the geometric center for the detected pilot mark, measuring an offset position between the geometric center of the basic area and the geometric center of the detected color pilot mark and utilizing the measured offset position for controlling a misregistration correction appliance of a printing press. The device for accomplishing the process includes an arrangement for performing each of the above-mentioned steps.

U.S. Pat. No. 5,138,667 can correct lengthwise and crosswise print misregistration and which considerably enhances the reliability for scanning of the marks but cannot recognize a damaged object and cannot recognize a candidate object with respect to a same pattern fiducial mark regardless of a size.

SUMMARY OF THE INVENTION

Therefore, an object of the present invention is to provide a method for recognizing a PCB fiducial mark which can exactly recognize a damaged object as well as a general object, can recognize a candidate object with respect to a same pattern fiducial mark regardless of a size, and can reduce a calculation amount relative to a polarity number of a candidate object when the candidate object has the polarity number.

In order to achieve the above object, the present invention provides a method for recognizing a printed circuit board fiducial mark in order to decide an origin point in a chip mounter, the method comprising the steps of:

a) storing printed circuit board fiducial mark recognition data including a threshold value of a similarity degree;

b) starting an image detection of a candidate object of a printed circuit board fiducial mark from a position of a subject including the printed circuit board fiducial mark marked in a printed circuit board, on which is mounted the chip mounter;

c) judging whether or not the image detection with respect to a candidate object is completed, when the image detection with respect to the candidate object is completed, judging that searching the printed circuit board fiducial mark has failed, and when the image detection with respect to the candidate object is not completed, judging whether or not a current detected candidate is a new candidate object;

d) detecting an image of a next candidate object of the subject and returning to a step of judging whether or not the image detection with respect to a candidate object is completed when the current detected candidate is not the new candidate object, and detecting an outline data of the new candidate object when the current detected candidate is not the new candidate object; and e) comparing the stored printed circuit board fiducial mark recognition data with the detected outline data of the new candidate object, and judging whether or not the new candidate object is the printed circuit board fiducial mark according to the comparison result.

Preferably, the step of comparing the stored printed circuit board fiducial mark recognition data with the detected outline data of the new candidate object in step e) includes e-1) calculating a center of the new candidate object; e-2) calculating a distance information of the new candidate object; e-3) calculating a similarity degree of the new candidate object and the printed circuit board fiducial mark; and e-4) judging whether or not the calculated similarity degree is equal to or less than the stored threshold value of the similarity degree, and judging whether or not the new object is the printed circuit board fiducial mark according to the judgement result. More preferably, the method further includes d-1) judging whether or not the detected outline data of the new candidate object is within a set allowable distance ratio and a set allowable aspect ratio; and d-2) going to a step of detecting an image of a next candidate object of the subject of step d) when it is judged that the detected outline data of the new candidate object is not within the set allowable distance ratio and the set allowable aspect ratio, and going to step e) when it is judged that the detected outline data of the new candidate object is not within the set allowable distance ratio and the set allowable aspect ratio, between step d) and step e).

Since the present invention can be used for a distorted image, it can exactly recognize a damaged object as well as a general object. The present invention can also reduce a calculation amount relative to a polarity number of a candidate object when the candidate object has the polarity number. The present invention can recognize a candidate object of the same pattern fiducial mark regardless of its size.

BRIEF DESCRIPTION OF THE DRAWINGS

The above objects and advantages of the present invention will become more apparent by describing in detail a preferred embodiment thereof with reference to the attached drawings, in which.

DESCRIPTION OF THE PREFERRED EMBODIMENT

A description will be given below in detail with reference to the accompanying drawings of the circuitry configuration, and the operation of a method for recognizing a PCB fiducial mark in order to decide an origin point in a chip mounter according to one embodiment of the present invention.

Figure 1A:
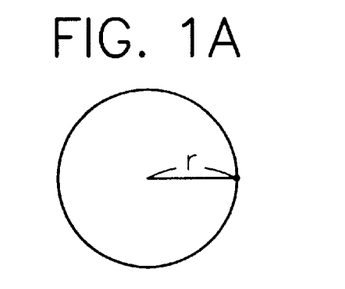
FIGS. 1A to 1F are views for showing patterns of fiducial mark which can be used in the present invention.
Figure 2A:
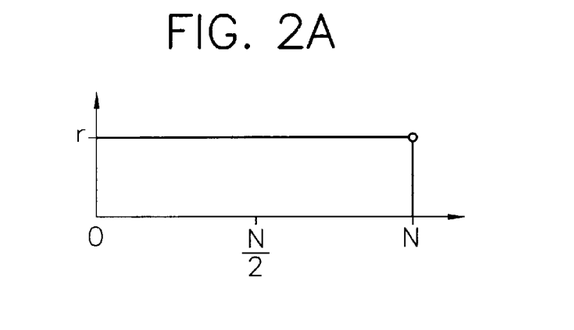
FIGS. 2A to 2D are graphs for indicating a distance information from a center of a candidate object to an outline as an angle function of the respective PCB fiducial marks shown in FIGS. 1A to 1D, respectively.

Fiducial marks include three kinds of patterns: a first pattern, a second pattern, and a third pattern. FIG. 1A shows a circle fiducial mark which has an infinite polarity number and is one example of the first pattern. FIG. 2A indicates a distance information from a center of a candidate object to an outline as an angle function of the circle fiducial marks shown in FIG. 1A. A calculation of a center of a candidate object is performed by means of an equation (1) or an equation (2) which will be described later.

$$C_x = \frac{1}{N} \sum_{i=1}^{N} X_i \quad (1)$$

$$C_y = \frac{1}{N} \sum_{i=1}^{N} Y_i$$

where $(C_x, C_y)$ is a center coordinate of the candidate object, $(X_i, Y_i)$ is an outline pixel coordinate of the candidate object, and N is an outline pixel number of the candidate object.

$$C_x = \frac{1}{N_s} \sum_{i=1}^{N_s} X_{si} \quad (2)$$

$$C_y = \frac{1}{N_s} \sum_{i=1}^{N_s} Y_{si}$$

where $(C_x, C_y)$ is a center coordinate of the candidate object, $(X_{si}, Y_{si})$ is a coordinate of all of the pixels of the candidate object, and $N_s$ is a pixel number of the candidate object.

It is supposed that a length from a center of the candidate object to an outline pixel thereof is l and an angle of the center of the candidate object and a definite straight line formed by the outline pixels thereof is θ. All lengths $l_i$ and all angles $\theta_i$ with respect to all outline pixels can be calculated. A distance information dist (n) is the average value of all outline pixels existing within a range of $n\Delta\theta < \theta_i \leq (n+1)\Delta\theta$ when 360° is divided by a constant unit angle Δθ.

$$dist(n) = \frac{1}{m_n} \sum_{i=1}^{m_n} l_i, \text{ where } n\Delta\theta < \theta_i \leq (n+1)\Delta\theta \quad (3)$$

N=360°/Δθ, Δθ=360°/N, and 0≦n<N, where N is an outline pixel number of the candidate object and $m_n$ is all the outline pixel numbers satisfying the inequality $n\Delta\theta<\theta_1\leq(n+1)\Delta\theta$.

A similarity degree SD1 is calculated by a first similarity degree calculating method of an equation (4) which will be described later for when a pattern of a fiducial mark is circle.

$$SD1 = \sum_{i=0}^{N-1} [OBJ(n) - DB(n)]^2 \quad (4)$$

where OBJ(n) is a distance information and DB(n) is a distance information of a circle fiducial mark.

Figure 1B:
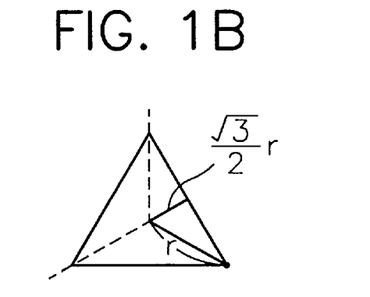
Figure 1C:
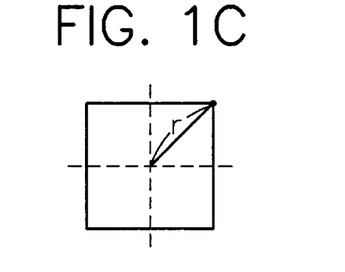
Figure 1D:
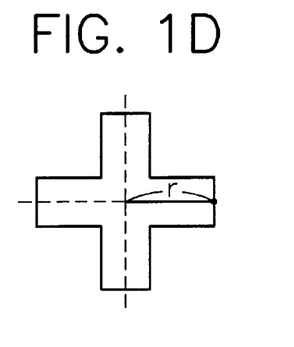
Figure 2B:
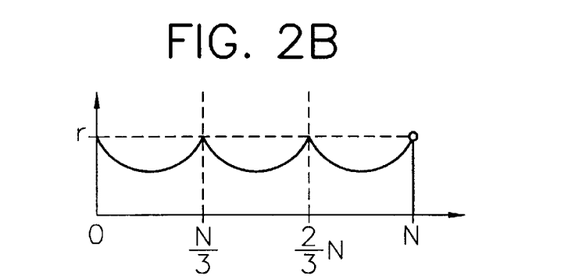
Figure 2C:
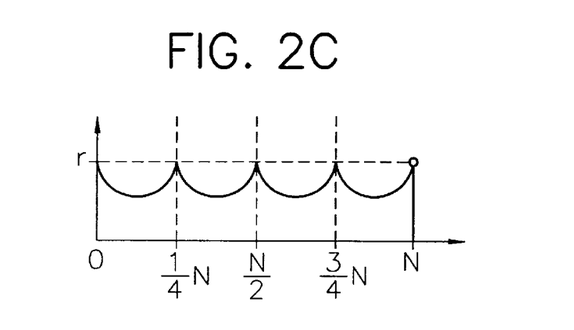
Figure 2D:
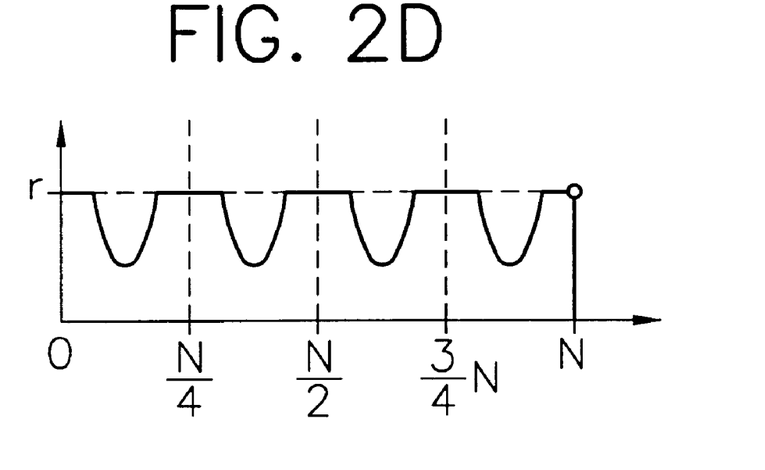
Figure 2E:
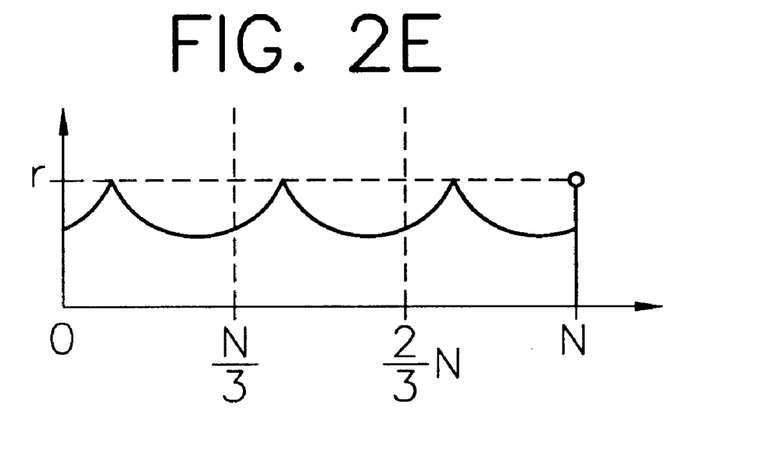
FIG. 2E is a graph for indicating a distance information from a center of a candidate object to an outline as an angle function of the PCB fiducial marks shown in FIG. 1D when a distance information of a candidate object do not correspond to those of the PCB fiducial mark.

FIG. 1B shows a triangle fiducial mark which a polarity number of 3 and is one example of the second pattern. FIG. 2B indicates a distance information from a center of the candidate object to an outline as an angle function of the circle fiducial marks shown in FIG. 1B. FIG. 1C shows a square fiducial mark which a polarity number of 4 and is another example of the second pattern. FIG. 2C indicates a distance information from a center of the candidate object to an outline as an angle function of the circle fiducial marks shown in FIG. 1C. FIG. 1D shows a cross fiducial mark which a polarity number of 4 and is a third example of the second pattern. FIG. 2D indicates a distance information from a center of the candidate object to an outline as an angle function of the circle fiducial marks shown in FIG. 1D. FIG. 2E is a graph for indicating a distance information from a center of the candidate object to an outline as an angle function of the fiducial marks shown in FIG. 1D when distance in formations OBJ(0), OBJ(1),OBJ(2), . . . , OBJ (N−2), OBJ(N−1) of a candidate object do not correspond to respective distance informations DB(0), DB(1), DB(2), . . . , DB(N−2), DB(N−1) of the fiducial mark.

A similarity degree SD2 is calculated by a second similarity degree calculating method of an equation (5) which will be described later for when a pattern of a fiducial mark is a second pattern having three polarity numbers. When a candidate object $$SD2 = \min[DIFF(k), 0 \le k < M] \quad (5)$$

$$M = N/F$$

$$DIFF(k) = \sum_{n=0}^{N-1} [OBJ(n) - DB((n+k)\%N)]^2$$

where N is a distance information number of the PCB fiducial mark, F is a polarity number of the PCB fiducial mark, M is a distance information number within a period, DIFF(K) is a similarity degree of the mark having at least three polarity numbers, OBJ(n) is a distance information of a candidate object, and DB(n) is a distance information of a PCB fiducial mark.

For instance, when a pattern of the fiducial mark is the triangle shown in FIG. 2B, the length $l_i$ is defined as $\sqrt{3}r/2 \le l_i \le r$. In the similarity degree SD2, a case that distance informations OBJ(0), OBJ(1), . . . OBJ(N−1) of the candidate object may not correspond to distance information DB(0), DB(1), . . . DB(N−1) of the fiducial mark, as shown in FIG. 2E. Accordingly, DB(0), DB(1),DB(2), . . . DB(N−1), DB(1),DB(2), . . . DB(N−1), DB(0) or DB(2), . . . DB(N−1), DB(0), DB(1) . . . are subtracted from OBJ(0), OBJ(1), . . . OBJ(N−1) and the minimum terms among the subtracted values are selected. The polarity number of the triangle fiducial mark is three and distance informations from 0° to 60° is equal to those from 60° to 120° and from 120° to 180°.

Figure 1E:
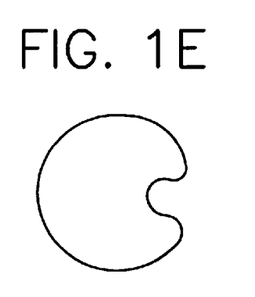
Figure 1F:
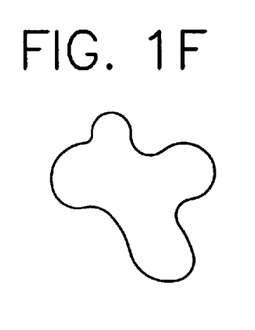

FIGS. 1E and 1F show free fiducial marks without polarity numbers as an example of the third pattern. A similarity degree SD3 is calculated by a third similarity degree calculating method of an equation (6) which will be described later when a pattern of a fiducial mark is a free pattern.

$$SD3 = \min[DIFF(k), 0 \le k < N] \quad (6)$$

$$DIFF(k) = \sum_{n=0}^{N-1} [OBJ(n) - DB((n+k)\%N)]^2$$

where N is a distance information number of the PCB fiducial mark, DIFF(k) is a similarity degree of the free PCB fiducial mark without a polarity number, OBJ(n) is a distance information of a candidate object, and DB(n) is a distance information of a free PCB fiducial mark.

Figure 3:
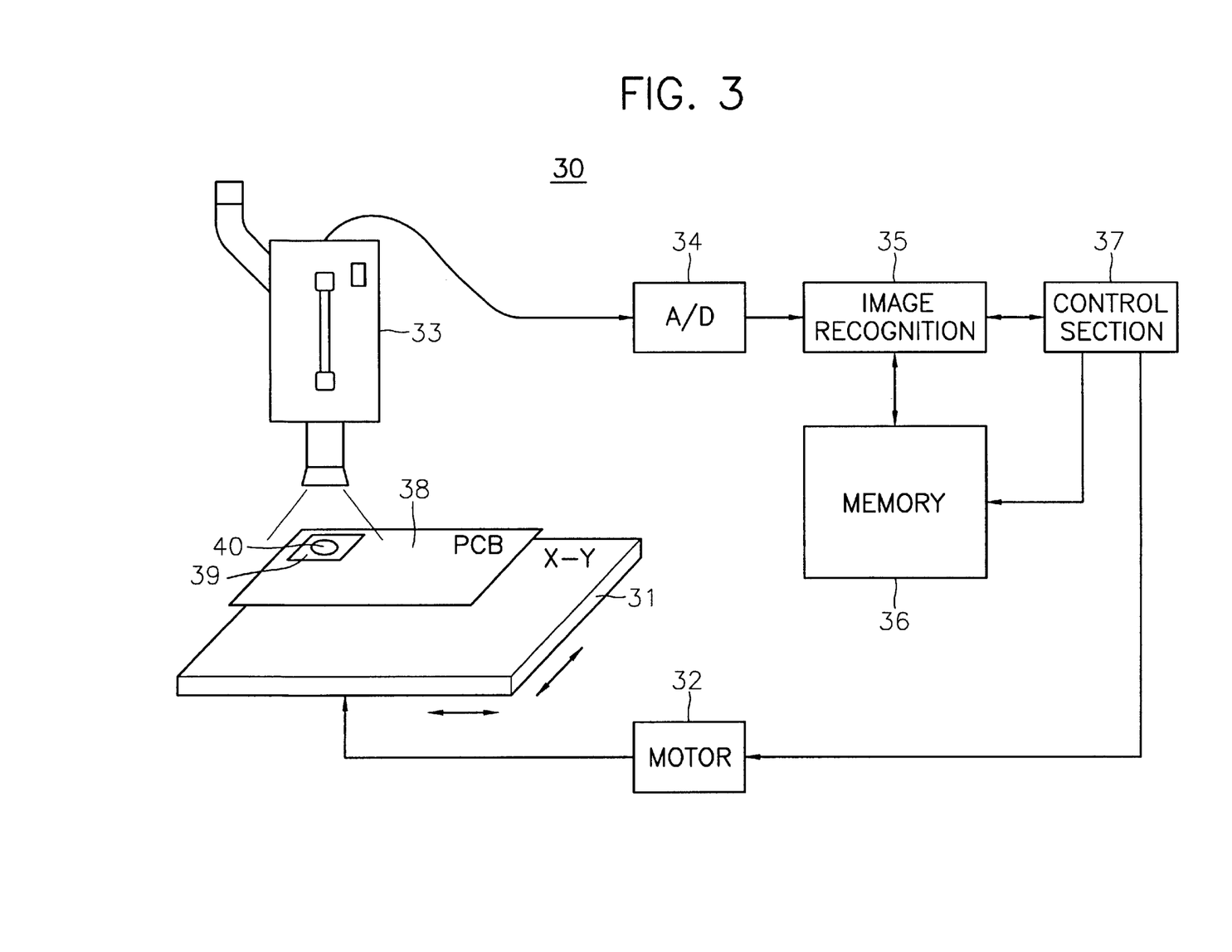
FIG. 3 is a view for showing a configuration of a fiducial mark recognizing system of a chip mounter which can be used in the present invention.

FIG. 3 shows a configuration of a fiducial mark recognizing system of a chip mounter which can be used in the present invention. The fiducial mark recognizing system of a chip mounter includes an X-Y table 31, a motor 32, a camera 33, an analog/digital (A/D) converter 34, an image recognition section 35, a memory 36, and a control section 37.

X-Y table 31 mounts an PCB 38 thereon. Motor 32 controls a displacement of X-Y table 31 to move PCB 38 to a camera 33. Camera 33 takes images for candidate objects of PCB 38 mounted on X-Y table 31 and provides the images to A/D converter 34. A/D converter 34 binarizes the images from camera 33 and supplies the binarized images to image recognition section 35. Image recognition section 35 judges whether or not the binarized images is a fiducial mark by using data stored in memory 36 and provides the judgement result to control section 37.

In memory 36, there are stored a distance information, a distance information number, a polarity number, a pixel number, a length ratio and an aspect ratio of each kind of PCB fiducial mark, a threshold value of a similarity degree, and a set allowable length ratio and a set allowable aspect ratio for a preliminary test. Preferably, a set allowable length ratio D for a preliminary test is defined as 0.7≦D≦1.2 and a set allowable aspect ratio A for a preliminary test is defined as 0.7≦A≦1.2. A. The distance information number of the fiducial mark N is preferably 32, 64, 128, or 256. The threshold value of the similarity degree is equal to or less than 0.15. Control section 37 controls operations of motor 32 and image recognition section 35.

Figure 4:
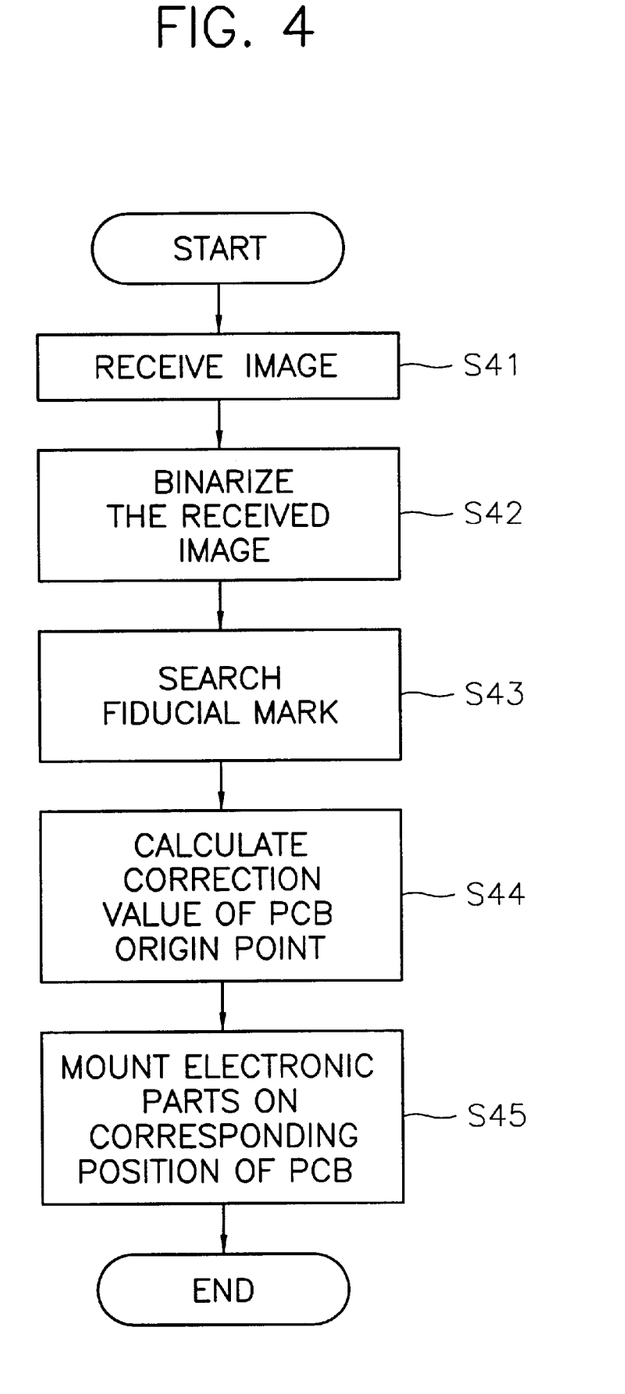
FIG. 4 is a flow chart for illustrating an origin point decision method in a chip mounter which can be used in the present invention.

FIG. 4 is a flow chart for illustrating an origin point decision method in a chip mounter which can be used in the present invention.

In step 41, when PCB 38 is mounted on a corresponding location of X-Y table 31 by means of motor 32 of fiducial mark recognizing system 30, camera 33 receives images of a subject 39 including candidate objects in which a PCB fiducial mark 40 in the mounted PCB 38 is marked and provides the received images of subject 39 to A/D converter 34. In step 42, A/D converter 34 binarizes the received images of subject 39 from camera 33 and supplies the binarized images of subject 39 to image recognition section 35.

In step 43, image recognition section 35 compares the binarized images of subject 39 from A/D converter 34 with PCB fiducial mark recognition data which are stored in memory 36 and searches PCB fiducial mark 40 by using the comparison result. In step 44, image recognition section 35 calculates a correction value of PCB origin point and transmits the calculated correction value to control section 37. Accordingly, control section 37 controls motor 32 to mount electronic parts on a corresponding position PCB 38 by using the calculated correction value (step 45).

Figure 5:
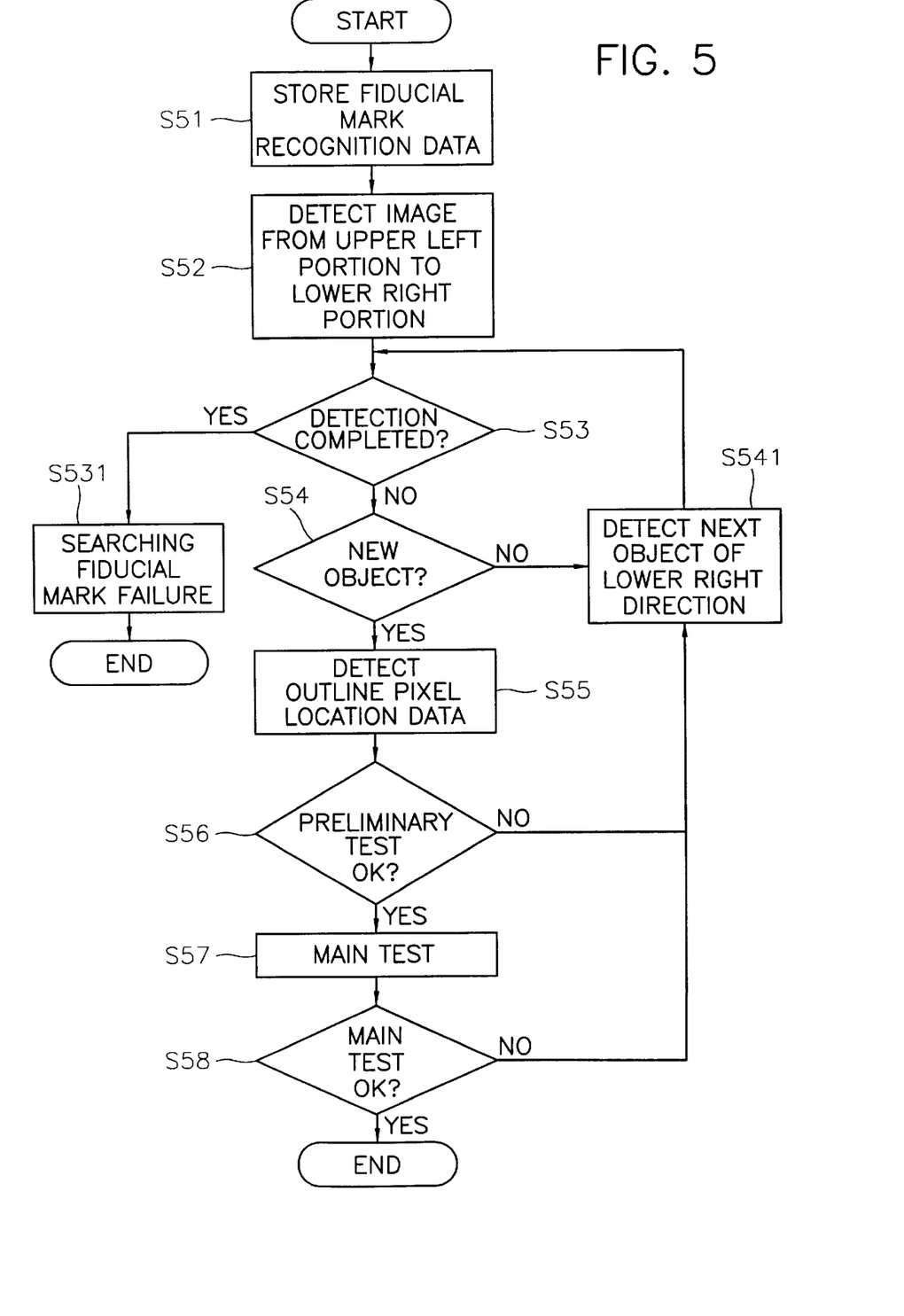
FIG. 5 is a flow chart for illustrating a method for recognizing a PCB fiducial mark in order to decide an origin point in a chip mounter according to one embodiment of the present invention.

Hereinafter, the method for recognizing a PCB fiducial mark in order to decide an origin point in a chip mounter according to one embodiment of the present invention will be described with reference to FIGS. 5 and 6. FIG. 5 illustrates a PCB fiducial mark recognition method for deciding an origin point in a chip mounter according to one embodiment of the present invention.

In step 51, control section 37 stores in memory 36 PCB fiducial mark recognition data in an address thereof before searching the fiducial mark. The PCB fiducial mark recognition data includes a distance information, a distance information number, a polarity number, a pixel number, a length ratio and an aspect ratio of each kind of PCB fiducial mark, a threshold value of a similarity degree, and a set allowable length ratio and a set allowable aspect ratio for a preliminary test. In step 52, image recognition section 35 detects images of the candidate object from an upper left portion to a lower right portion of subject 39.

In step 53, control section 37 judges whether or not the image detection of the candidate object is completed. When it is judged that the image detection of the candidate object is completed in step 53, if control section 37 judges that all the candidate objects detected are not the PCB fiducial mark so that searching the PCB fiducial mark 40 has failed (step 531), the image detection operation finishes. When it is judged that the image detection of the candidate object is not completed in step 53, control section 37 judges whether or not the current candidate object detected by means of image recognition section 35 is a new candidate object (step 54).

When it is judged that the current detected candidate object is not the new candidate object in step 54, image recognition section 35 detects a next candidate object in a lower right direction in subject 39 (step S541), and the routine returns to step S53. On the other hand, when it is judged that the current detected candidate object is the new candidate object in step 54, control section 37 detects outline pixel location data of the new candidate object (step 55).

In step 56, control section 37 judges whether or not the detected outline pixel location data of the new candidate object is within a predetermined range of a set allowable distance ratio D and a set allowable aspect ratio A for a preliminary test. In the present invention, preferably, the set allowable distance ratio D for a preliminary test is $0.7 \leq D \leq 1.2$ and the set allowable aspect ratio A for a preliminary test is $0.7 \leq A \leq 1.2$. When it is judged that the detected outline pixel location data of the new candidate object is not within the predetermined range in step 56, the routine returns to step S541. However, when it is judged that the detected outline pixel location data of the new candidate object is within the predetermined range in step 56, a main test is performed (step 57).

In step S58, control section 37 judges whether or not the main test has been performed. When it is judged that the main test has not been performed in step S58, the routine returns to step S541. In contrast, when it is judged that the main test has been performed in step S58, a total operation finishes.

Figure 6:
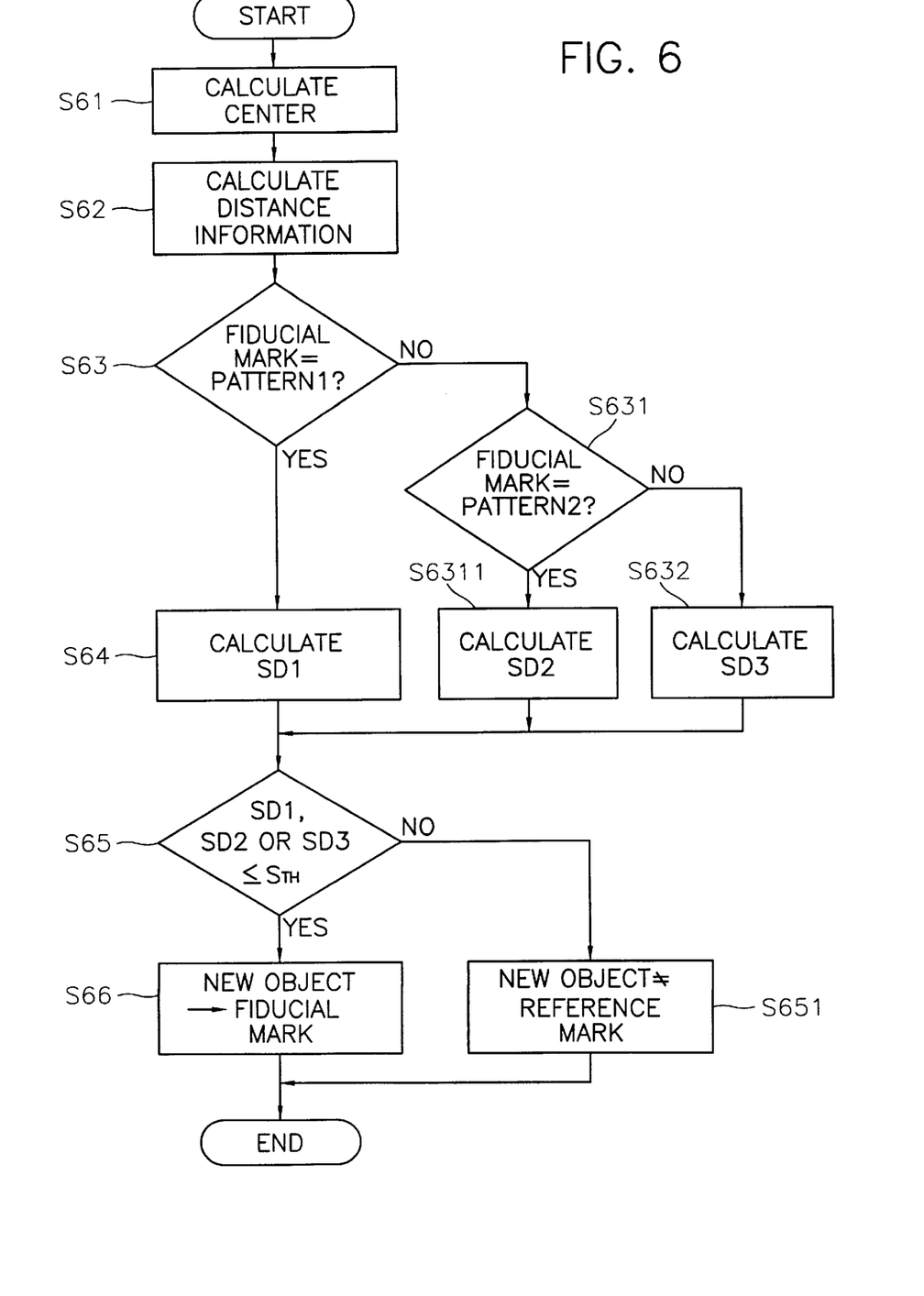
FIG. 6 is a flow chart for illustrating a method for performing a main test of the method of FIG. 5.

FIG. 6 is a flow chart for illustrating a method for performing a main test in the method of FIG. 5. The main test of FIG. 6 calculates a similarity degree of a candidate object and a PCB fiducial mark in different manners in accordance with different patterns of the similarity degree by using distance infromations from a center of the candidate object to an outline and recognizes that the candidate object is a fiducial mark whether or not the similarity degree is within a threshold value.

In step S61, control section 37 calculates a center ($C_x$, $C_y$) of the new object by means of equation (1) or (2). In step S62, control section 37 calculates distance information dist(n) of the new object by means of equation (3).

In step S63, control section 37 judges whether or not a pattern of a PCB fiducial mark stored in memory 33 is a pattern 1 (circle) having a polarity number that is infinite. When it is judged that the pattern of the PCB fiducial mark stored in memory 33 is the pattern 1 in step S63, control section 37 calculates a similarity degree SD1 of the new candidate object by the first similarity degree calculating method of equation (4) (step S64). In contrast, when it is judged that the pattern of the PCB fiducial mark is not the pattern 1 in step S63, control section 37 judges whether or not the pattern of a PCB fiducial mark stored in memory 33 is a pattern 2 having at least 3 polarity numbers (step S631).

When it is judged that the pattern of the PCB fiducial mark stored in memory 33 is the pattern 2 in step S631, control section 37 calculates a similarity degree SD2 of the new candidate object by the second similarity degree calculating method of equation (5) (step S6311). On the other hand, when it is judged that the pattern of a PCB fiducial mark stored in memory 33 is not the pattern 2 in step S631, control section 37 judges that the pattern of the PCB fiducial mark stored in memory 33 is a pattern 3 (a free fiducial mark without a polarity number) and calculates a similarity degree SD3 of the new candidate object by the third similarity degree calculating method of equation (6) (step S632).

After step S64, step S6311, or step S632 has been completed, control section 37 judges whether or not the calculated similarity degree (SD1, SD2, or SD3) of the new candidate object is equal to or less than a threshold value $S_{TH}$ (step S65). In the present invention, the threshold value $S_{TH}$ is set at 0.15. When it is judged that the calculated similarity degree of the new candidate object is equal to or less than the threshold value ($S_{TH}$) 0.15, control section 37 recognizes that the new candidate object is the PCB fiducial mark (step S66), and the main test finishes. On the other hand, when it is judged that the calculated similarity degree of the new candidate object is greater than the threshold value ($S_{TH}$) 0.15, control section 37 recognizes that the new candidate object is not the PCB fiducial mark (step S651), and the main test finishes.

As described above, since the present invention can be used for a distorted image, it can exactly recognize a damaged object as well as a general object. The present invention can also reduce a calculation amount relative to a polarity number of a candidate object when the candidate object has the polarity number. The present invention can recognize a candidate object of the same pattern fiducial mark regardless of its size.

The invention has been described in detail in connection with the preferred embodiment. This embodiment, however, is merely for example only and the invention is not restricted thereto. It will be easily understood by those skilled in the art that other variations and modifications can easily be made within the scope of this invention as defined by the appended claims.

What is claimed is:

1. A method for recognizing a fiducial mark on a printed circuit board in order to decide an origin point in a chip mounter, said method comprising the steps of:

a) storing fiducial mark recognition data including at least reference distance data from a center point to each boundary pixel of the fiducial mark, a total number of the reference distance data, a polarity number of the fiducial mark and a similarity threshold value, to form a reference database in a data storing means;

b) taking an image of a test area which is a portion of the printed circuit board, where the test area is wide enough for including one or more candidate objects and the fiducial mark is a member of the candidate objects, and transforming the image into digital data;

c) successively searching into the digital data of the image of the test area to meet all the candidate object;

d) calculating coordinates of boundary pixels of the candidate object which has been met during the searching step c);

e) calculating a coordinate of a center point of the candidate object from the coordinates of the boundary pixels of the candidate object, and then calculating distance data, whose number is equal to the total number of the reference distance data, from the center point to the boundary pixels;

f) calculating a similarity degree between the candidate object pattern and the pattern of the fiducial mark by means of a similarity function, where a particular similarity function is used for calculating the similarity degree according to the polarity number of the fiducial mark, and the distance data of the candidate object and the reference distance data of the fiducial mark are used by the similarity function for calculating the similarity degree; and g) verifying whether a pattern of the candidate object is similar to a pattern of the fiducial mark by comparing the similarity degree which has been calculated with the similarity threshold value.

2. The method as claimed in claim 1, wherein the center point of the candidate object is calculated by following equations, $$C_x = \frac{1}{N}\sum_{i=1}^{N} X_i \text{ and } C_y = \frac{1}{N}\sum_{i=1}^{N} Y_i,$$

where ($C_x$, $C_y$) is the coordinate of the center point of the candidate object, ($X_i$, $Y_i$) is the coordinate of the boundary pixels of the candidate object, and N is a total number of the boundary pixels of the candidate object.

3. The method as claimed in claim 1, wherein the center point of the candidate object is calculated by following equations:

$$C_x = \frac{1}{N_s}\sum_{i=1}^{N_s} X_{si} \text{ and } C_y = \frac{1}{N}\sum_{i=1}^{N_s} Y_{si},$$

where ($C_x$, $C_y$) is the coordinate of the center point of the candidate object, ($X_{si}$, $Y_{si}$) is a coordinate of all the pixels forming the candidate object, and $N_s$ is a total number of all the pixels forming the candidate object.

4. The method as claimed in claim 1, wherein the distance data from the center point to the boundary pixels of the candidate object is calculated by a following equation, $$dist(n) = \frac{1}{m_n}\sum_{i=1}^{m_n} l_i$$

where each $m_n$ is the total number of boundary pixels each of whose azimuth angle $\theta_i$ viewed from the center point of the candidate object satisfies $n\Delta\theta<\theta_i\leq(n+1)\Delta\theta$, $\Delta\theta$ is a unit angle of the candidate object, n is natural number whose value is equal to or less than $360/\Delta\theta$, each $l_i$ is distance from the center point of the candidate object to each of the boundary pixels thereof, dist(n) is an average distance of the distance data $l_i$.

5. The method as claimed in claim 1, wherein, in the case where the fiducial mark is a circle mark whose the polarity number is infinite, the similarity function is as followings, $$SD1 = \sum_{i=0}^{N-1} [OBJ(n) - DB(n)]^2$$

where SD1 is the similarity degree between the candidate object and the fiducial mark, OBJ(n) is the distance data of the candidate object, and DB(n) is the reference distance data of a circle fiducial mark.

6. The method as claimed in claim 1, wherein, in the case where the fiducial mark is a polygon whose the polarity number is equal or more to three and less than infinite, the similarity function is as follows, $$SD2=\min[DIFF(k)], 0\leq k<M \text{ and } M=N/F$$

$$DIFF(k) = \sum_{n=0}^{N-1} [OBJ(n) - DB((n+k)\%N)]^2$$

where SD2 is the similarity degree between the candidate object and the fiducial mark, N and F are the total number of the reference distance data and the polarity number of the fiducial mark respectively, M is reference distance data number within a range of polarity-to-polarity, each of DIFF(k) is distance difference between the distance data of the candidate object and the reference distance of the fiducial mark within the range of polarity-to-polarity, OBJ(n) is distance data of the candidate object which has been calculated, DB(n) is the reference distance data of the fiducial mark which has been stored, and % is a modular operator.

7. The method as claimed in claim 1, wherein, in the case where the fiducial mark is a free mark whose the polarity number is one, the similarity function is as followings, $$SD3=\min[DIFF(k)], 0\leq k<N$$

$$DIFF(k) = \sum_{n=0}^{N-1} [OBJ(n) - DB((n+k)\%N)]^2$$

where N is the total number of the reference distance data of the free mark, each of DIFF(k) is distance difference between the distance data of the candidate object and the reference distance of the fiducial mark, OBJ(n) is the distance data of the candidate object which has been calculated, and DB(n) is the reference distance data of the fiducial mark which has been stored, and % is a modular operator.

8. The method as claimed in claim 1, wherein in the verifying step when the calculated similarity degree is equal to or less than the stored similarity threshold value, the candidate object which has been met is taken as the fiducial mark to find, and when the calculated similarity degree is greater than the stored similarity threshold value, the candidate object which has been met is not taken as the fiducial mark to find.

9. The method as claimed in claim 1, further comprising the steps for preliminary test of:

storing an allowable range of pixel number in the data storing means;

calculating a total pixel number of the candidate object;

comparing the total pixel number of the candidate object is within the allowable range of pixel number to find out whether the candidate object is a suspected fiducial mark; and discarding the candidate object not to calculate the similarity degree when the total pixel number of the candidate object is out of the allowable range of pixel number, and embracing the candidate object to calculate the similarity degree when the total pixel number of the candidate object is within the allowable range of pixel number.

10. The method as claimed in claim 1, wherein storing an allowable range of a rectangular size and an allowable aspect ratio range of a rectangular in the data storing means;

calculating a width, a length and an aspect ratio of a rectangular within which the candidate object is just fitted;

comparing the width, the length and the aspect ratio of the rectangular is within the allowable range of the rectangular size and the allowable aspect ration to find out whether the candidate object is a suspected fiducial mark; and discarding the candidate object not to calculate the similarity degree when the width, the length and the aspect ratio of the rectangular is out of the allowable range of the rectangular size and the allowable aspect ratio, and embracing the candidate object to calculate the similarity degree when the width, the length and the aspect ratio of the rectangular is out of the allowable range of the rectangular size and the allowable aspect ratio.

* * * * *